(12) United States Patent
Frohberg et al.

(10) Patent No.: US 7,442,638 B2
(45) Date of Patent: Oct. 28, 2008

(54) METHOD FOR FORMING A TUNGSTEN INTERCONNECT STRUCTURE WITH ENHANCED SIDEWALL COVERAGE OF THE BARRIER LAYER

(75) Inventors: Kai Frohberg, Niederau (DE); Katja Huy, Dresden (DE); Volker Kahlert, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 183 days.

(21) Appl. No.: 11/423,900

(22) Filed: Jun. 13, 2006

(65) Prior Publication Data

US 2007/0077749 A1 Apr. 5, 2007

(30) Foreign Application Priority Data

Sep. 30, 2005 (DE) ........................ 10 2005 046 976

(51) Int. Cl.
*H01L 21/4763* (2006.01)
(52) U.S. Cl. ........................ 438/638; 437/637; 437/672; 437/673; 437/E21.169
(58) Field of Classification Search ......... 438/637–638, 438/672–673, 706–700, 618–624
See application file for complete search history.

(56) References Cited

U.S. PATENT DOCUMENTS

| | | | |
|---|---|---|---|
| 6,492,262 B2 | 12/2002 | Uzoh | 438/637 |
| 6,652,718 B1 | 11/2003 | D'Couto et al. | 204/192.3 |
| 6,764,940 B1 | 7/2004 | Rozbicki et al. | 438/627 |
| 6,841,468 B2 | 1/2005 | Friedemann et al. | 438/627 |
| 2003/0116427 A1* | 6/2003 | Ding et al. | 204/192.17 |
| 2003/0203615 A1 | 10/2003 | Denning et al. | 438/627 |
| 2003/0216035 A1 | 11/2003 | Rengarajan et al. | 438/637 |
| 2004/0094402 A1 | 5/2004 | Gopalraja et al. | 204/192.12 |
| 2004/0137714 A1 | 7/2004 | Friedemann et al. | 438/627 |
| 2005/0093155 A1 | 5/2005 | Kahlert et al. | 257/751 |
| 2005/0266682 A1* | 12/2005 | Chen et al. | 438/637 |

FOREIGN PATENT DOCUMENTS

| | | |
|---|---|---|
| EP | 0 735 577 A2 | 10/1996 |
| WO | WO 02/091461 A2 | 11/2002 |

* cited by examiner

*Primary Examiner*—Dung A. Le
(74) *Attorney, Agent, or Firm*—Williams, Morgan & Amerson, P.C.

(57) ABSTRACT

By performing a re-sputter process during the formation of a barrier layer for a contact opening in a tungsten-based process, the reliability of the tungsten deposition, as well as the performance of the resulting contact plug, may be enhanced. During the re-sputtering process, a thickness of the titanium-based barrier layer may be reduced at the contact bottom, while at the same time the material is re-condensed on critical lower sidewall portions of the contact opening.

16 Claims, 3 Drawing Sheets

METHOD FOR FORMING A TUNGSTEN INTERCONNECT STRUCTURE WITH ENHANCED SIDEWALL COVERAGE OF THE BARRIER LAYER

BACKGROUND OF THE INVENTION

1. Field of the Invention

The present invention relates to the field of semiconductor manufacturing, and, in particular, to the formation of a tungsten-based interconnect structure involving the deposition of a thin conductive barrier layer in a high aspect ratio opening.

2. Description of the Related Art

During the process of manufacturing sophisticated semiconductor devices, such as modern CPUs, a plurality of different material layers are deposited on each other and patterned to define required device features. In general, subsequent material layers should exhibit good adhesion to each other while at the same time maintaining the integrity of each individual layer, i.e., chemical reaction of adjacent layers and/or diffusion of atoms from one layer into the other layer should be avoided during the manufacturing processes for the fabrication of the individual layers and subsequent processes as well as afterwards when operating the completed device. To meet these requirements, an intermediate layer is often required to provide good adhesion and to suppress diffusion and thus undue interference between neighboring materials during processing and operation. A typical example of this in the fabrication of semiconductor devices is the formation of interconnect plugs, wherein openings and trenches having a bottom region and a sidewall region have to be provided with a corresponding intermediate layer, that is a conductive barrier layer, so that a subsequently deposited conductive material exhibits good adhesion to the surrounding dielectric layer, and undue interaction during processing and operation may be avoided. In advanced semiconductor devices, the interconnect plugs are typically formed of a tungsten-based metal and are provided in an interlayer dielectric stack which is typically comprised of silicon dioxide, including a bottom etch stop layer typically formed of silicon nitride.

In general, the electrical resistance of the barrier metal layer is significantly higher than the resistance of the tungsten-based material forming the contact plug, so that the thickness of the barrier metal layer is selected to be as small as possible in order to avoid unduly increasing the overall resistance of the contact plug.

In modern integrated circuits, openings (so-called vias) are formed exhibiting an aspect ratio that may be as high as approximately 8:1 or more, and the opening may have a diameter of 0.1 μm or smaller. The aspect ratio of such openings is generally defined as the ratio of the depth of the opening to the width of the opening. Accordingly, it is extremely difficult to form a thin, uniform barrier metal layer on the entire sidewalls, especially at the bottom corners, to effectively avoid direct contact of the metal with the surrounding dielectric material, i.e., it is difficult to form a barrier metal layer that adequately covers all surfaces of the openings.

With reference to FIG. 1, a typical conventional process for manufacturing contacts to a circuit device in accordance with a well-established tungsten technology will now be described in more detail in order to illustrate the problems involved in the formation of a reliable conductive barrier layer.

FIG. 1 schematically shows a semiconductor device 100 during a manufacturing stage for the formation of interconnect plugs providing a connection to a circuit element, such as a transistor 110, that is formed above an appropriate semiconductor substrate 101. The circuit element 110 may comprise one or more contact regions, such as a gate electrode 111 and drain and source regions 112. The circuit element 110 is covered by a dielectric material, which may comprise a contact etch stop layer 102, which may be formed of silicon nitride, and an interlayer dielectric material 103, which is typically silicon dioxide. Moreover, two contact openings 104a, 104b are formed within the dielectric layers 103 and 102 so as to connect to the respective contact regions 111 and 112. Furthermore, a conductive barrier layer, which is typically comprised of a titanium liner 105 and a titanium nitride layer 106 in tungsten contact technology, is formed on the dielectric layer 103 and within the contact openings 104a, 104b. The titanium liner 105 and the titanium nitride barrier layer 106 may be formed so as to enhance the reliability of the subsequent deposition of a tungsten-based material, wherein the deposition process is typically performed as a chemical vapor deposition (CVD) process, in which tungsten hexafluorine ($WF_6$) is reduced in a thermally activated first step on the basis of silane ($SiH_4$) and is then, in a second step, converted into tungsten on the basis of hydrogen. During the reduction of the tungsten on the basis of silane, a direct contact to the silicon dioxide of the dielectric layer 103 is substantially prevented by the barrier layer 106 in order to avoid undue silicon consumption from the silicon dioxide. However, titanium nitride exhibits a rather poor adhesion to silicon dioxide and may therefore jeopardize the reliability of the respective tungsten plug formed subsequently. Consequently, the titanium liner 105 is provided for improving adhesion of the barrier layer 106.

A typical process flow for forming the semiconductor device 100 as shown in FIG. 1 may comprise the following processes. After the formation of the circuit element 110 on the basis of well-established manufacturing techniques, the contact etch stop layer 102 may be formed on the basis of well-known plasma enhanced chemical vapor deposition (PECVD) techniques, followed by the deposition of the silicon dioxide of the layer 103 on the basis of TEOS, thereby providing a dense and compact material layer. After any optional planarization processes for planarizing the layer 103, a photolithography sequence may be performed on the basis of well-established recipes, followed by anisotropic etch techniques for forming the contact openings 104a, 104b in the layer 103, wherein the etch process may reliably be controlled on the basis of the etch stop layer 102. Thereafter, a further etch process may be performed to finally open the contact etch stop layer 102 on the basis of well-established techniques. Thereafter, the titanium liner 105 may be formed on the basis of ionized physical vapor deposition, such as sputter deposition. The term "sputtering" or "sputter deposition" describes a mechanism in which atoms are ejected from a surface of a target material upon being hit by sufficiently energetic particles. Sputtering has become a dominant technique for depositing titanium, titanium nitride and the like. Although, in principle, an improved step coverage could be obtained by using CVD techniques, sputter deposition is widely used for the deposition of the liner 105 for the following reasons.

Sputter deposition allows the relatively uniform deposition of layers over large area substrates, since sputtering can be accomplished from large-area targets. Control of film thickness by sputter deposition is relatively simple as compared to CVD deposition and may be achieved by selecting a constant set of operating conditions, wherein the deposition time is then adjusted to achieve the required film thickness. Moreover, the composition of compounds, such as titanium nitride used in the barrier layer 106, can be controlled more easily and precisely in sputter deposition processes as compared to CVD. Additionally, the surfaces of the substrates to be processed may be sputter-cleaned prior to the actual film deposition so that any contamination of the surface may be efficiently removed and further re-contamination prior to the actual deposition process may be effectively suppressed. For an efficient deposition of a moderately thin material within the contact openings 104a, 104b having a moderately high aspect ratio, so-called ionized sputter deposition techniques are used, in which target atoms liberated from the target are efficiently ionized by a respective plasma ambient while moving towards the substrate. On the basis of a DC or RF bias, the directionality of the moving ionized target atoms may be significantly enhanced, thereby enabling the deposition of target material at the bottom of the contact openings 104a, 104b even for high aspect ratios.

Due to this mechanism, however, the layer thickness at the bottom 104c may be significantly thicker compared to a thickness at the sidewalls of the contact openings 104a, 104b, even though these sidewalls may be covered by a substantially continuous layer. In particular, at lower sidewall portions 104d, the corresponding layer thickness may be significantly thinner compared to the thickness at the bottom 104c. However, a reliable and thus minimum layer thickness may be required, especially at the bottom sidewall portions 104d, in order to substantially prevent any deleterious interaction during the subsequent tungsten deposition. For example, for a minimum layer thickness of approximately 50-60 Å at the lower sidewall portions 104d, a bottom layer thickness of approximately 300-400 Å may be required, thereby resulting in an increased contact resistivity as the combination of titanium nitride and titanium exhibits a moderately high resistance compared to the contact regions 112 and the subsequently filled-in tungsten.

In view of the situation described above, there exists a need for an enhanced technique that enables the formation of a reliable titanium and titanium nitride barrier layer for tungsten-based contact technology while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of contacts in semiconductor devices, which may exhibit a significantly enhanced reliability and performance, since, in tungsten-based contact technology, the required conductive barrier layer may be deposited such that enhanced sidewall coverage at lower portions of the contact openings is achieved, while at the same time a thickness at the contact opening bottom is reduced, thereby also reducing the contact resistance. For this purpose, after or during the deposition of the conductive barrier material, a re-sputter process may be performed to redistribute material from the bottom to the sidewalls.

According to one illustrative embodiment of the present invention, a method comprises forming a contact opening in an interlayer dielectric material so as to connect to a contact region of a circuit element and depositing a titanium-containing barrier layer in the contact opening. Moreover, the method comprises redistributing material from the titanium-containing barrier layer from a bottom of the contact opening onto a lower sidewall portion by directed sputtering on the basis of an inert species.

According to another illustrative embodiment of the present invention, a method comprises forming a conductive barrier layer in a contact opening by sputter deposition and re-sputtering material of the conductive barrier layer from a bottom of the contact opening to sidewalls thereof. Finally, the contact opening is filled with a tungsten-containing material.

BRIEF DESCRIPTION OF THE DRAWINGS

The invention may be understood by reference to the following description taken in conjunction with the accompanying drawings, in which like reference numerals identify like elements, and in which.

Figure 1:
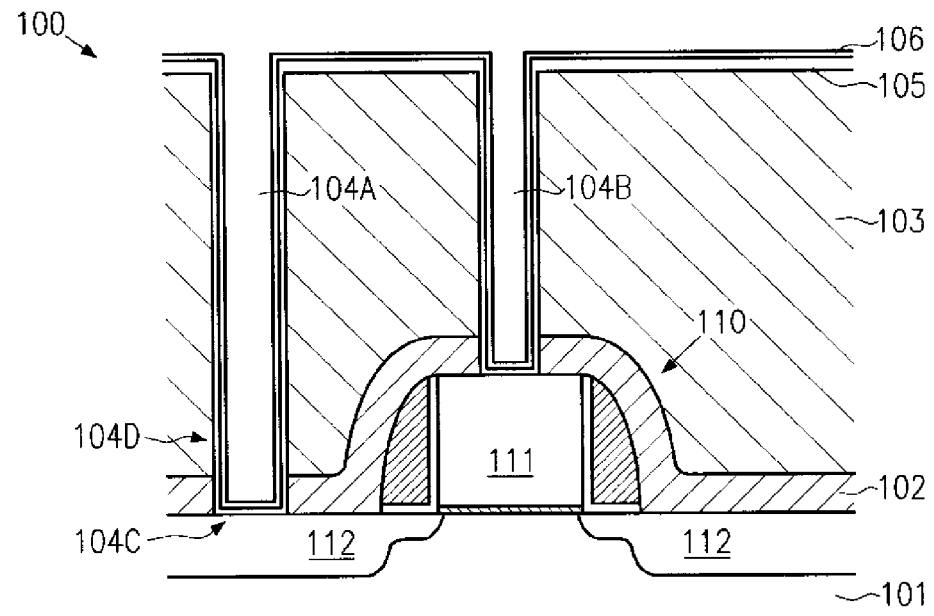
FIG. 1 schematically shows a cross-sectional view of a semiconductor device during the formation of contacts on the basis of a tungsten technology including the formation of titanium-based barrier layers in accordance with a conventional process flow.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention contemplates an enhanced technique for the formation of an improved conductive barrier layer for forming tungsten-based contacts in semiconductor devices. For this purpose, the present invention provides various methods and techniques for combining enhanced manufacturability, performance and reliability in sophisticated sputter methods. As described herein, during the formation of a conductive barrier layer to be formed in a contact opening, sputter deposition is used in combination with a re-sputtering technique, thereby extending the use of sputter technology to the fabrication of contact structures of even highly scaled semiconductor devices, which may have a critical dimension with respect to the gate length of 90 nm and even less. A thin conductive barrier layer, such as titanium and titanium nitride, may be reliably formed on sidewalls of the contact openings, especially at lower portions thereof, while at the same time the layer thickness at the bottom of the contact opening may be significantly reduced, thereby contributing to an enhanced performance of the resulting contact. Moreover, in some illustrative embodiments, enhanced techniques are provided which may further improve reliability of the barrier layer formation in that any variations of the contact structure, which may stem from a different depth of the contact openings and the like, are nevertheless reliably covered by the barrier layer even after re-sputtering a portion of the material. For this purpose, a short final deposition step may be carried out after the re-sputtering process, wherein an appropriate parameter setting is selected, thereby providing a sufficient degree of coverage while still maintaining the advantages obtained by the preceding re-sputtering process. In some illustrative embodiments, the final deposition step may be performed for a fixed time period, thereby significantly reducing the degree of process control required.

Figure 2A:
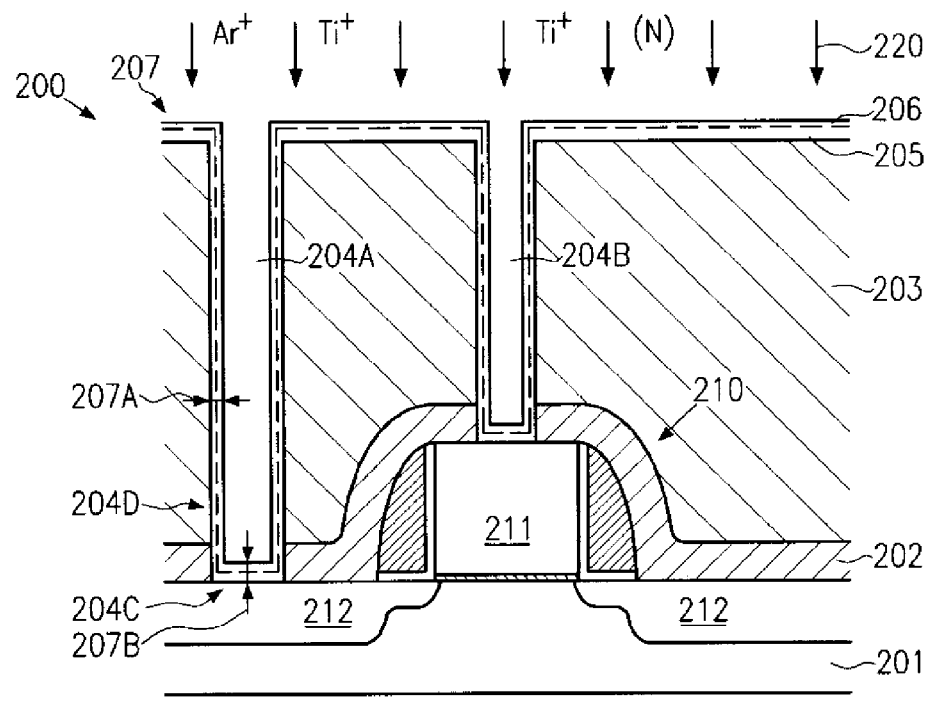
FIGS. 2a-2d schematically show a semiconductor device in cross-sectional view during the formation of contacts to a circuit element on the basis of a tungsten contact technology by using a re-sputtering technique in accordance with illustrative embodiments of the present invention.

With reference to FIGS. 2a-2d, further illustrative embodiments of the present invention will now be described in more detail. FIG. 2a schematically shows a semiconductor device 200 that comprises a circuit element 210 which is formed above a substrate 201. The substrate 201 may represent any appropriate substrate for forming semiconductor devices thereon, such as a silicon-on-insulator (SOI) substrate, a bulk semiconductor substrate, or any other appropriate carrier having formed thereon a suitable semiconductor layer for forming circuit devices thereon and therein. The circuit element 210, which may represent a transistor, a capacitor, an interconnect line and the like, may comprise one or more contact regions 211, 212, which in the example shown are represented by a gate electrode, i.e., the contact region 211, and drain and source regions, i.e., the contact regions 212. Moreover, a dielectric layer stack is formed above the circuit element 210 and may be comprised of any appropriate dielectric material as is required for reliably isolating and passivating the circuit element 210. In one illustrative embodiment, a contact etch stop layer 202, for instance comprised of silicon nitride or any other appropriate material, may be provided, followed by an interlayer dielectric layer 203, which may be formed of one or more appropriate dielectric materials. In one illustrative embodiment, the dielectric layer 203 may be substantially comprised of silicon dioxide. Contact openings 204a, 204b may be formed in the dielectric layers 203 and 202, thereby providing a connection to the respective contact regions 211 and 212. Moreover, the semiconductor device 200 is illustrated during a deposition process 220 for forming a conductive barrier layer 207, which may be required for a subsequent process for filling the contact openings 204a, 204b with a tungsten-based conductive material, as is also described previously with reference to FIG. 1. It should be appreciated that, in this stage of manufacture, the conductive barrier layer 207 may be comprised of a single layer, or in other embodiments may include two or more sub-layers, wherein the corresponding sub-layers are indicated by the dashed line and are denoted as a first layer 205 and second layer 206.

The semiconductor device 200 as shown in FIG. 2a may be formed in accordance with well-established techniques for forming circuit elements, such as the circuit element 210 on the basis of any appropriate crystalline, polycrystalline and amorphous semiconductor materials. In illustrative embodiments, the circuit element 210 may represent a circuit element of a highly advanced silicon-based semiconductor device, wherein minimum critical dimensions, such as gate length, i.e., in FIG. 2a the horizontal dimension of the gate electrode 211, may be 90 nm and less or even 50 nm and less for highly advanced devices. Thus, after the formation of the circuit element 210, the contact etch stop layer 202 and the interlayer dielectric material 203 may be deposited on the basis of well-established techniques, typically involving a CVD technique with or without a plasma-assisted deposition atmosphere. Thereafter, the contact openings 204a, 204b may be formed by photolithography and advanced etch techniques, wherein, depending on the design requirements, a width of the openings 204a, 204b may be of the same order of magnitude as the corresponding critical dimensions. Thereafter, the device 200 is exposed to the deposition ambient 220 for forming the conductive barrier layer 207, which, in one illustrative embodiment, is a titanium-containing material layer, wherein the first layer 205 may be provided in the form of a titanium liner, while the second layer 206 may be provided in the form of a titanium nitride layer. However, the conductive barrier layer 207 may be comprised of other appropriate materials, as long as the required passivation of the neighboring dielectric material of the layer 203 with respect to the subsequent tungsten process is guaranteed.

In one illustrative embodiment, the deposition ambient 220 represents the process conditions encountered in an ionized sputter deposition process. For instance, the deposition ambient 220 may be established in a magnetron sputter deposition tool (not shown), which may comprise moveable or stationary magnets located above an appropriate target material (not shown), which may, in one illustrative embodiment, be comprised of titanium. The sputter deposition tool, which may be any conventional sputter tool, typically comprises corresponding ionization systems for establishing the required plasma ambients for liberating target atoms and for providing the required bias power for adjusting the directionality of the target and carrier gas ions within the ambient 220. Moreover, the deposition ambient 220 may be defined by an appropriate pressure, such as approximately 1 mTorr to several Torr, so as to control the amount of ions and number of scattering events which the ions in the ambient 220 may encounter during their way to the device 200. As is well known, the number of target ions may depend on a plurality of parameters, such as DC power used for ionizing the carrier gas atoms for liberating the target atoms, the gas pressure, the distance of the ionizing system from the corresponding target, and the like. Moreover, the directionality of the target ions may be controlled on the basis of the bias power, the pressure, the distance of the corresponding ionization means for ionizing target atoms liberated from the target with respect to the substrate, and the like. In this way, material of the conductive barrier layer 207 may be reliably deposited within the contact openings 204a, 204b, wherein, however, due to the deposition kinetics, a thickness of the layer 207 at the sidewalls of the openings 204a, 204b, indicated as 207a, may be significantly less as compared to a thickness 207b at a bottom 204c of the openings 204a, 204b.

It should be appreciated that, in some embodiments, the layer 207 may be composed of the liner 205, which may be deposited in a first phase with appropriately adjusted parameters for the deposition ambient 220, while the second layer 206 may be formed in a subsequent phase by appropriately changing the deposition ambient 220. For example, in one illustrative embodiment, the layer 205 may be deposited as a titanium liner for a specified deposition time for otherwise fixed deposition parameters, and thereafter nitrogen or a nitrogen-containing carrier gas may be supplied to the deposition ambient 220 so as to initiate the deposition of titanium nitride. The process sequence disclosed herein may be performed as an in situ process, wherein a transition between the layer 205 and 206 may be more or less sharp, depending on the process conditions. In other illustrative embodiments, the conductive barrier layer 207 in this stage of manufacture may be comprised of a substantially single material composition, such as titanium. Due to the very different layer thickness at the sidewalls 204d and the bottom 204c, which may be several nm and up to 20 nm or even more, the device 200 may be subjected to a re-sputter process or material distribution process based on an appropriately designed sputter atmosphere.

Figure 2B:
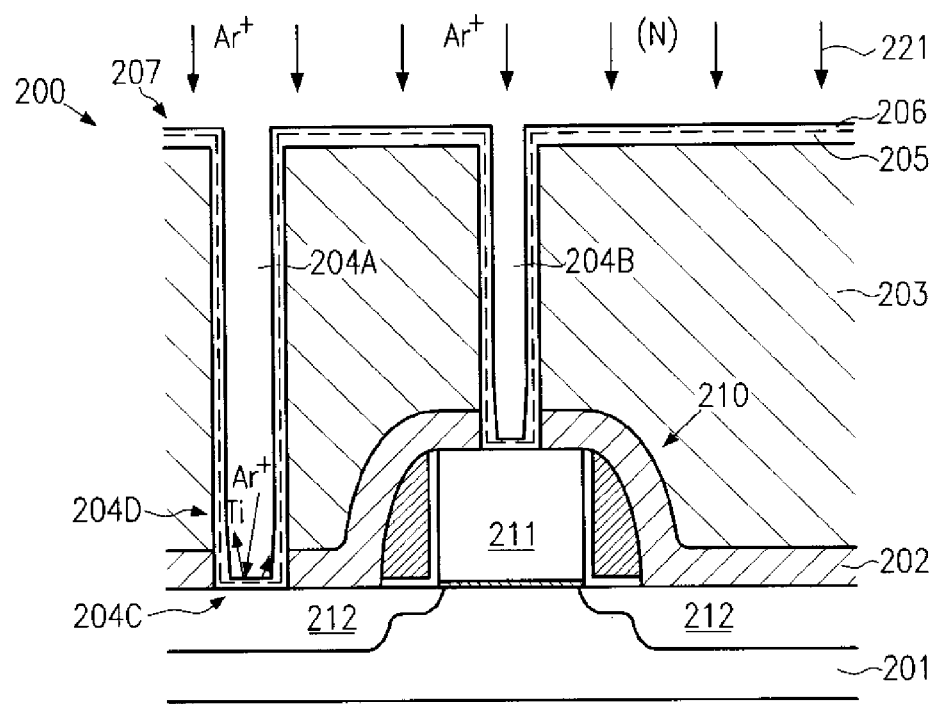

FIG. 2b schematically shows the device subjected to a re-sputter or redistribution atmosphere 221, which, in illustrative embodiments, is obtained by correspondingly changing one or more process parameters used for establishing the deposition atmosphere 220. For example, in a conventional sputter deposition tool, the ionization of the carrier gas, such as argon or any other inert species, such as other noble gases, may be reduced at the vicinity of the target, thereby significantly reducing or avoiding a liberation of further target atoms. On the other hand, ionization of atoms remotely from the target may be maintained so as to generate an enlarged number of ions of the inert species. Moreover, an electrical field established for adjusting the directionality of the ions moving towards the device 200 may be adjusted so as to obtain a substantially orthogonal trajectory with respect to the device 200, while a pressure in the ambient 221 may be adjusted to a moderately low value, for instance approximately 1-40 mTorr so as to reduce the number of scattering events. Consequently, as illustrated in FIG. 2b, ions of the inert species, such as argon ions, impinge preferably on horizontal portions, such as the bottom 204c of the contact openings, thereby liberating atoms of the previously formed barrier layer 207, which then mainly re-condense on the lower sidewall portions 204d, thereby improving the average thickness at these areas, while significantly reducing the thickness at the bottom 204c. In some illustrative embodiments, a corresponding re-sputtering or redistribution of material of the layer 207 may be achieved by first substantially forming the complete conductive barrier layer 207, which may be comprised of the first layer 205 and the second layer 206, and subsequently, as a final process, material may be redistributed on the basis of the ambient 221.

In other embodiments, a first portion of the layer 207 may be formed, for instance in the form of the layer 205, which may then subsequently be re-sputtered, followed by a further deposition step, for instance for forming the second layer 206, followed by a further final re-sputtering process so as to obtain the required reduced thickness at the bottom 204c, wherein a significant amount of the second layer 206 is re-deposited on the lower sidewall portions 204d, thereby significantly reducing the probability for material corruption of the dielectric layer 203 in the subsequent tungsten process. In still other embodiments, the first layer 205 may be deposited with a required thickness and thereafter the re-sputtering may be performed as described above. Thereafter, the second layer 206, for instance comprised of titanium nitride, may be sputter deposited, without a subsequent redistribution, wherein, nevertheless, due to the preceding re-sputtering of the first layer 205, a reduced thickness at the bottom 204c may be achieved.

In other illustrative embodiments, pattern-specific characteristics during the formation of the conductive barrier layer 207 may be taken into consideration, as the re-sputtering process may behave differently due to a difference in depth of the contact openings 204a, 204b and due to other structural irregularities, in that a final short deposition step is performed, irrespective of the preceding sputter and re-sputter regime, so as to reliably cover even critical locations within the contact openings 204a, 204b at least with material of the second layer 206.

Figure 2C:
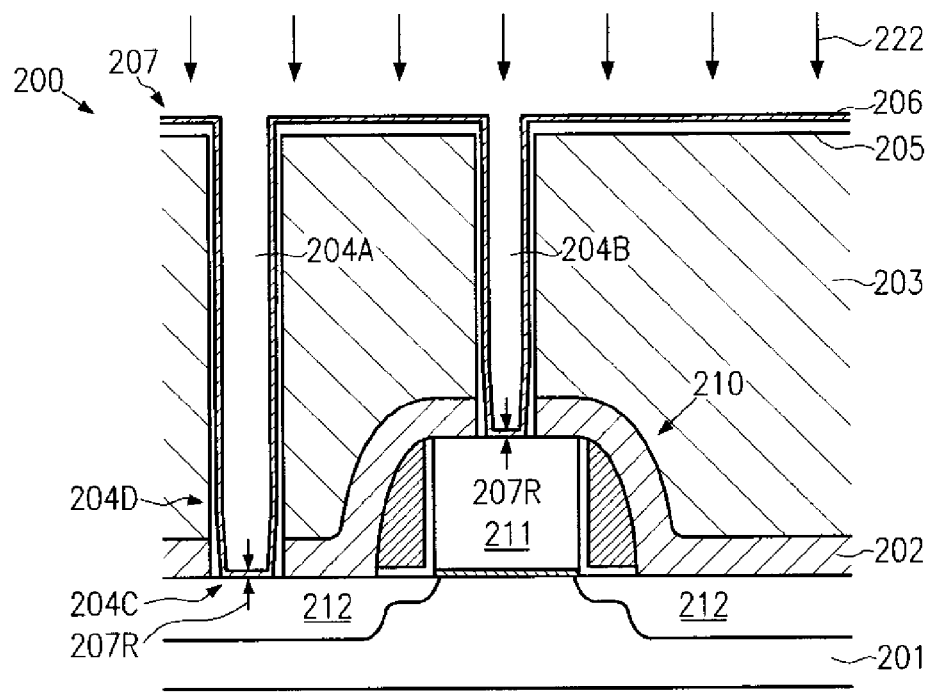

FIG. 2c schematically shows the semiconductor device 200 during a final short deposition step in a deposition ambient 222 to form a thin layer 206a, which may have substantially the same material composition as the layer 206, if provided, to ensure a reliable coverage of critical areas, such as the lower sidewall portions 204d and other structure irregularities. The deposition ambient 222 may be obtained by at least changing one process parameter with respect to the re-sputter ambient 221. For example, the previously used deposition parameters, i.e., the parameters of the deposition ambient 220, may be re-established so as to continue with a deposition of material which may be the required barrier material. That is, the deposition atmosphere 220 is designed such that, for a titanium-based barrier layer, a titanium nitride material is deposited to form the layer 206a. In other illustrative embodiments, the pressure in the deposition atmosphere 222 may be increased with respect to the pressure used in the re-sputtering ambient 221 to provide reduced directionality of the incoming ions, while the number of target ions may also be increased, when the re-sputter process has been performed with a substantially inert plasma ambient. For instance, for a typical conventional sputter deposition tool, a pressure in the range of 1 mTorr to several mTorr and a bias power of several hundred watts may be used for the re-sputtering ambient 221, whereas a similar or higher pressure with a significantly reduced bias power of approximately 100-300 watts may be used in the final deposition atmosphere 222.

In still a further illustrative embodiment, a process time for the final deposition step using the atmosphere 222 may be set in advance and the final deposition process may be performed for this fixed time period, for instance for a time period in the range of approximately 1-5 seconds, wherein the deposition may be performed without any further process control, thereby significantly relaxing control requirements with respect to endpoint detection or a reliable coverage. Consequently, a reliable coverage of the surface portions of the contact openings 204a, 204b may be ensured, irrespective of any process non-uniformities of the preceding re-sputtering process on the basis of the ambient 221 which may be caused by structural irregularities and/or a difference in configuration, as is for instance the case for the openings 204a, 204b. Consequently, the contact openings 204a, 204b may be reliably covered by the barrier layer 207, which, in one particular embodiment, at least includes titanium nitride as an uppermost material layer, while at the same time a significantly reduced thickness 207r at the bottom 204c may be achieved. After the completion of the barrier layer 207, the further processing may be continued by depositing a tungsten-based material, such as tungsten, by means of a CVD process using tungsten hexafluorine and silane on the basis of a two-step thermally activated deposition process, as is previously discussed. It should be appreciated, however, that other deposition schemes for a tungsten-based material may be used. Thereafter, any excess material and the horizontal portions of the conductive barrier layer 207 may be removed by any appropriate technique, such as chemical mechanical polishing, in accordance with well-established process recipes.

Figure 2D:
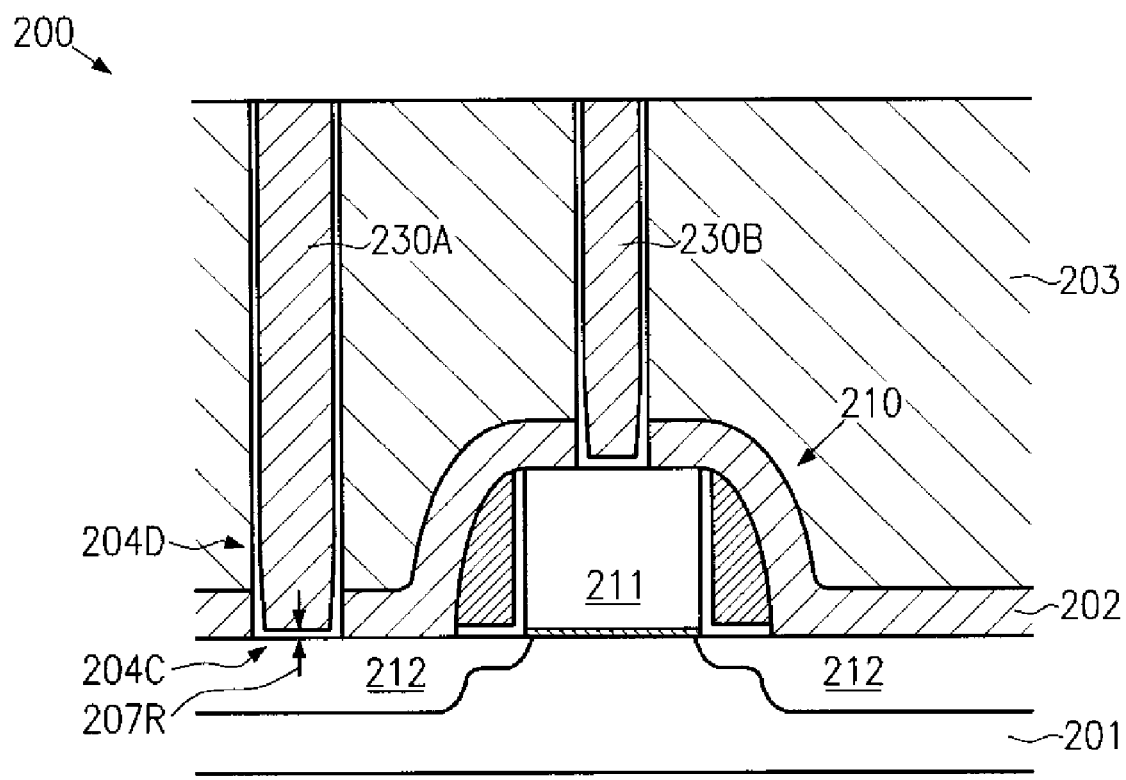

FIG. 2d schematically shows the semiconductor device 200 after the completion of the above-described process sequence. Hence, the device 200 comprises contact plugs 230a, 230b that are filled with a tungsten-based material, wherein the reduced thickness 207r provides significantly reduced contact resistance compared to the conventional device as shown in FIG. 1.

As a result, the present invention provides an improved technique for the formation of contacts based on a tungsten contact technology, wherein a conductive barrier layer, such as a titanium, titanium nitride-based barrier layer, is formed by sputter deposition followed by a re-sputtering process to redistribute material from the bottom to lower sidewall portions of the respective contact openings. Consequently, a required minimum target thickness for the barrier layer may be selected less compared to conventional approaches, since the critical lower sidewall portions may be reliably covered by the barrier layer, while at the same time the resulting layer thickness at the bottom of the contact openings is significantly reduced. Therefore, the same degree of reliability during the processing of the tungsten-based material may be achieved with an overall reduced thickness due to a significantly reduced safety margin required. Alternatively, for a specified deposition recipe, the reliability may be significantly enhanced while at the same time the contact performance is increased. Moreover, in some illustrative embodiments, the efficiency of the re-sputtering process may be enhanced by performing a short final deposition step to compensate for any possible structural irregularities and structural differences of the respective contact openings. Hereby, the deposition time during the final deposition step is significantly less compared to the actual material deposition and may, in some embodiments, require no additional process control so that process complexity is not increased, while on the other hand process uniformity may be enhanced.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a contact opening in an interlayer dielectric material so as to connect to a contact region of a circuit element;
    depositing a titanium-based barrier layer in said contact opening by forming a titanium layer followed by a titanium nitride layer by sputter deposition;
    redistributing a portion of said titanium nitride layer and said titanium layer from said titanium-based barrier layer from a bottom of said contact opening to a lower sidewall portion by directed sputtering on the basis of an inert species; and
    sputter depositing a final portion of titanium nitride for a time period that is shorter than a preceding deposition time.

2. The method of claim 1, wherein said titanium-based barrier layer is deposited by sputter deposition.

3. The method of claim 1, further comprising depositing a tungsten-based material to fill said contact opening.

4. The method of claim 1, wherein depositing said titanium-based barrier layer comprises forming a titanium layer by sputter deposition, and wherein redistributing material from said titanium-based barrier layer comprises re-sputtering a portion of said titanium layer.

5. The method of claim 4, wherein forming said titanium-based barrier layer further comprises forming a titanium nitride layer on said titanium layer by sputter deposition.

6. The method of claim 5, wherein redistributing material of said titanium-based barrier layer further comprises re-sputtering a portion of said titanium nitride layer.

7. The method of claim 5, wherein said titanium nitride layer is deposited after redistributing any material from said titanium-based barrier layer.

8. The method of claim 1, wherein redistributing said material comprises controlling a plasma ambient used for said directed sputtering by controlling at least one of bias power and a gas pressure prevailing in said plasma ambient.

9. A method, comprising:
    forming a conductive barrier layer in a contact opening by sputter deposition by forming a first layer followed by a second layer of a different composition;
    re-sputtering a portion of said first layer and said second layer of said conductive barrier layer from a bottom of said contact opening to sidewalls thereof;
    sputter depositing a final portion of said conductive barrier layer for a time period that is shorter than a preceding deposition time; and
    filling said contact opening with a tungsten-containing material.

10. The method of claim 9, wherein said conductive barrier layer comprises titanium and titanium nitride.

11. The method of claim 9, wherein said re-sputtering is performed with an inert ion species.

12. The method of claim 9, wherein forming said conductive barrier layer comprises sputter depositing a first layer, and wherein re-sputtering material of said barrier layer comprises re-sputtering a portion of said first layer.

13. The method of claim 12, wherein forming said conductive barrier layer further comprises forming a second layer on said first layer by sputter deposition.

14. The method of claim 13, wherein re-sputtering material of said conductive barrier layer further comprises re-sputtering a portion of said second layer.

15. The method of claim 13, wherein said second layer is deposited after re sputtering any material of said conductive barrier layer.

16. The method of claim 9, wherein re-sputtering material of said conductive barrier layer comprises controlling a plasma ambient by controlling at least one of a bias power and a gas pressure prevailing in said plasma ambient.

* * * * *